United States Patent [19]
Benz

[11] Patent Number: 5,339,019
[45] Date of Patent: Aug. 16, 1994

[54] CURRENT SINK

[75] Inventor: Paul Benz, Stuttgart, Fed. Rep. of Germany

[73] Assignee: ALCATEL N.V., Amsterdam, Netherlands

[21] Appl. No.: 87,356

[22] Filed: Jul. 8, 1993

Related U.S. Application Data

[63] Continuation of Ser. No. 806,315, Dec. 13, 1991, abandoned.

[30] Foreign Application Priority Data

Dec. 24, 1990 [DE] Fed. Rep. of Germany ....... 4041761

[51] Int. Cl.$^5$ ............................................. G05F 1/56
[52] U.S. Cl. ..................................... 323/286; 323/278; 323/312
[58] Field of Search ............... 323/282, 286, 351, 273, 323/312, 265, 349, 278; 250/214 A; 330/59; 307/105, 111, 296.1, 491

[56] References Cited

U.S. PATENT DOCUMENTS

| | | | |
|---|---|---|---|
| 3,671,770 | 6/1972 | Frederiksen | 307/310 |
| 4,498,001 | 2/1985 | Smoot | 250/214 A |
| 4,586,000 | 4/1986 | Wagner | 330/252 |
| 4,623,786 | 11/1986 | Rodwell | 250/214 |
| 4,634,894 | 1/1987 | Shu et al. | 307/297 |
| 4,639,617 | 1/1987 | Giakoumis | 307/296 R |
| 4,644,254 | 2/1987 | Panse | 323/282 |
| 4,716,358 | 12/1987 | Fucito | 323/316 |
| 4,771,228 | 9/1988 | Hester et al. | 323/315 |
| 4,794,247 | 12/1988 | Stineman, Jr. | 250/214 A |
| 4,821,166 | 4/1989 | Albach | 363/89 |
| 4,853,610 | 8/1989 | Schade, Jr. | 323/316 |
| 4,978,867 | 12/1990 | Pfennings | 307/296.6 |

FOREIGN PATENT DOCUMENTS

| | | |
|---|---|---|
| 0181146 | 5/1986 | European Pat. Off. . |
| 3021678 | 12/1980 | Fed. Rep. of Germany . |
| 3530064 | 3/1987 | Fed. Rep. of Germany . |
| 3629938 | 3/1988 | Fed. Rep. of Germany . |
| 3736380 | 5/1988 | Fed. Rep. of Germany . |
| WO81/02819 | 10/1981 | PCT Int'l Appl. . |

Primary Examiner—Steven L. Stephan
Assistant Examiner—Adolf Berhane
Attorney, Agent, or Firm—Spencer, Frank & Schneider

[57] ABSTRACT

A current sink includes an electronic component having a switched current path and a control terminal. The current path can be switched to a low-impedance condition by the control terminal to sink a current flowing into it. A component having a frequency-dependent passband is connected to the control terminal for passing signals of a predetermined frequency range.

9 Claims, 2 Drawing Sheets

CURRENT SINK

This application is a continuation of application Ser. No. 07/806,315, filed Dec. 13, 1991 now abandoned.

BACKGROUND OF THE INVENTION

1. Field of the Invention

The present invention relates to a current sink and in particular to a current sink having a current path which can be switched to a low impedance condition.

2. Background Information

A current sink, like a current source, is part of any electric circuit. Since it is generally formed by a load and referred to as such, the term "current sink" is almost invariably used only if the load function as such is less significant, e.g., if different currents are to be separated from each other, in particular, if an AC signal impressed on a direct current is to be capacitively coupled out of the direct-current circuit and processed separately. In that case, a direct-current sink must be present in parallel with the output capacitance in order to maintain the flow of direct current.

Such a direct-current sink may be formed by a resistor, a choke, or a semiconductor circuit acting as a resistance or as an inductive reactance.

DE-OS 36 29 938, for example, describes an electronic choke (gyrator circuit) for implementing the loop closure in telephone private branch exchanges which uses controlled semiconductors (Darlington circuits)) as direct-current sinks.

A direct-current sink is particularly necessary in optical receivers where the electric output signal from an optical-to-electric transducer, a PIN diode or an avalanche photodiode (APD), is to be amplified and evaluated. The optical-to-electric transducer delivers an electric signal with a large DC component on which the useful AC (radio-frequency) signal is superimposed. If a broadband amplifier following the optical-to-electric transducer is supplied with the direct-current signal, it will be overloaded or, since the operating points of its amplifier stages will be shifted, its dynamic range will be reduced.

In the above example, the use of a conventional current sink, such as a resistor connected across the amplifier input or a transistor operated as resistor, reduces the amplifier's input resistance presented to the AC signal and contributes to undesirable noise. It thus reduces the sensitivity of the broadband amplifier. This increases the number of repeaters required in, e.g., a fiber-optic transmission link, thus adding to the cost of such a link. A high-inductance choke across the amplifier input would also result in a low resistance to the useful AC (radio-frequency) signal because of the choke's unavoidable winding capacitance.

SUMMARY OF THE INVENTION

It is the object of the invention to provide a current sink which requires little circuitry and presents a high resistance to currents in a predetermined frequency range.

This object is attained by providing a current sink having a control terminal and a switched current path, the input of the switched current path being connected to the control terminal by a frequency dependent component.

The invention makes it possible, for example, to use the switched current path of a transistor, according to one embodiment of the invention, as a current sink, but to control this switched current path so that it only acts as a current sink for direct current while presenting a high impedance to alternating current.

This is achieved according to an embodiment of the invention by placing a capacitor between the base and the emitter of the transistor. Since the capacitor represents a short circuit for alternating current, AC voltage amplitudes appearing at the emitter of the transistor are transmitted nearly fully to the base terminal of the transistor. The base-emitter voltage as well as the base current and, hence, the (direct) current flowing through the collector-emitter path of the transistor remain unchanged. Thus, the transistor's switched current path, which presents a low resistance to direct current, does not affect an AC voltage signal superimposed on the emitter voltage. The current sink thus presents a high impedance to alternating voltages.

In another embodiment of the invention, a filter is used in place of a capacitor, the current sink being thereby made frequency-selective. Then, all frequencies outside a range determined by the filter, for example, can be attenuated by the current sink, thus improving the filtering action.

According to a further advantageous feature of the invention, a transistor with a high-resistance control input is used in place of a conventional transistor. Field-effect transistors, in particular, have such high-resistance control inputs.

The electronic component sinking the current flowing into it can also be implemented, according to a further embodiment, with a circuit having several transistor functions, such as an operational amplifier, for example. Since the current flowing through the control terminal is negligible in this case, a voltage divider, required to set the control voltage, can have an extremely high resistance, so that the component to be inserted between the switched current path and the control terminal can be of a low-cost design.

A further advantageous aspect of the invention allows the component between the switched current path and the control terminal to be used for a dual purpose, namely as part of the current sink, and to couple the useful signal out of the circuit including the current sink.

Further embodiments of the invention relate to uses of the current sink together with broadband amplifiers as are employed, for example, in conjunction with optical transducers for optical communication. According to one embodiment, the current sink is additionally used to protect a broadband amplifier against overload.

BRIEF DESCRIPTION OF THE DRAWINGS

Embodiments of the invention will now be described in detail with reference to the accompanying drawings, in which.

DETAILED DESCRIPTION OF THE PREFERRED EMBODIMENTS

Figure 1:
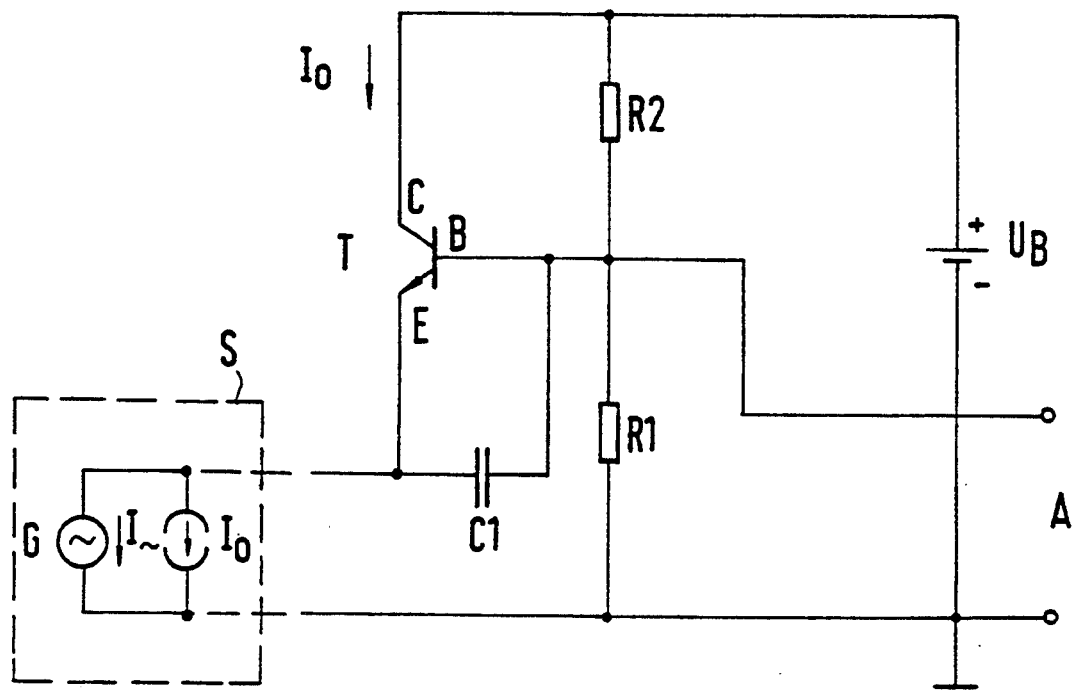
FIG. 1 illustrates an embodiment of the invention by the example of a direct-current sink.

In FIG. 1, a bipolar transistor T has its switched current path CE (collector to emitter) connected into a circuit from the positive terminal of a DC voltage source $U_B$ through the transistor T and a signal source S to the negative terminal of the voltage source $U_B$. Connected in parallel with the voltage source $U_B$ is a voltage divider consisting of resistors R1, R2 which sets a given base potential for the transistor T the junction of R1 and R2 being connected to the base terminal B of the transistor. The signal source S has a resistance which is not too low, and is capable of passing a direct current coming from the collector-emitter path CE of the transistor T to the negative terminal of the voltage source $U_B$.

Thus, in the steady state, a direct current $I_O$ determined by the ohmic resistance of the signal source, and by the base potential and the current gain of the transistor T, flows in the circuit. The base-emitter voltage of the transistor T assumes a fixed value, since a capacitor C1 connected between the base B and the emitter E of the transistor T becomes charged to the base-emitter voltage of the transistor T after a short time. The collector-emitter path (switched current path) CE of the transistor T acts as a current sink for the current flowing out of the signal source S.

However, if the signal source S additionally delivers an AC signal as an acoustic-to-electric or optical-to-electric transducer does, voltage variations will occur at the output of the signal source S and, hence, at the emitter E of the transistor T. In the absence of the capacitor C1, these variations would be highly attenuated by the transistor T since the signal-source impedance would introduce negative feedback. The current sink formed by the transistor would thus also affect the resulting alternating current (AC signal).

According to the invention, the capacitor C1 is provided between the emitter E and base B terminals of the transistor T. It represents an AC short circuit and ensures that alternating voltages appearing at the emitter E of the transistor T are nearly fully transmitted to the base B of the transistor T, so that the base-emitter voltage and, hence, the resistance of the collector-emitter path CE will not change and the negative feedback will not become effective for alternating voltages (AC signal). Consequently, nearly the full level of the AC voltage signal is present at the emitter terminal E of the transistor T or also at the base terminal B of the transistor T and can be taken from an output A for further processing, as shown in FIG. 1. Since the AC voltage signal is coupled out at the base terminal B of the transistor T, the capacitor C1 also functions as an output capacitance. If the AC signal were to be coupled out at the emitter terminal E, a separate output capacitance would have to be provided.

The operation of a bipolar transistor requires at least a small base current. Therefore, the voltage-divider resistors R1 and R2 must not have arbitrarily high values. Thus, to transmit the AC voltage signal from the emitter terminal E to the base terminal B as fully as possible, despite the base current and the finite voltage-divider resistances, a relatively large capacitor C1 is required. Also, the signal-source S impedance must not be too high. These constraints can be avoided if a field-effect transistor is used in place of a bipolar transistor.

Figure 2:
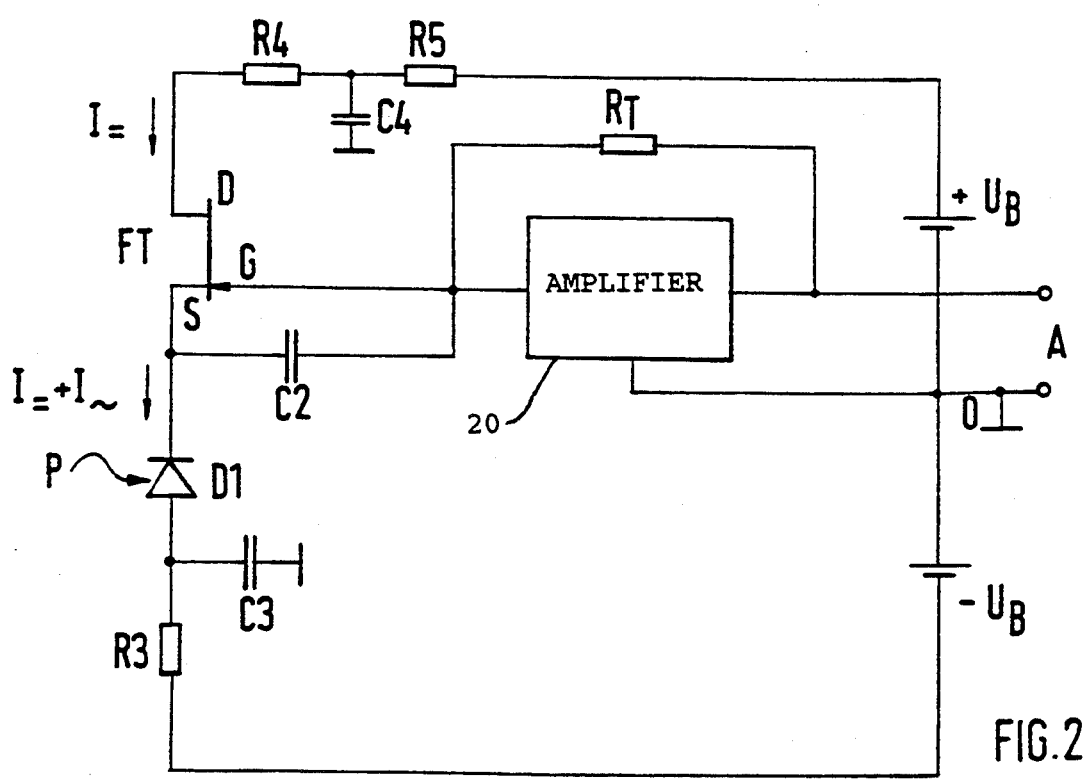
FIG. 2 shows an embodiment of the invention in an optical receiver.

The use of a field-effect transistor as a direct-current sink presenting a high resistance to alternating current is illustrated in FIG. 2 in an optical receiver. The signal source is a PIN diode D1 which converts light P emerging from, e.g., an optical waveguide, to a radio-frequency electric signal. The cathode of the PIN diode is connected to the source terminal S of a field-effect transistor (FET) FT. The source-gate path SG of the FET is bypassed by a capacitor C2. Connected to the gate terminal G of the FET is the input of a transimpedance amplifier 20 whose output A provides the amplified radio-frequency signal. The input and the output of the transimpedance amplifier 20 are connected via a transimpedance resistor $R_T$.

The operating current for the PIN diode D1 comes from two series-connected voltage sources $+U_B$, $-U_B$, whose center tap 0 is connected to reference potential (ground), and is supplied to the PIN diode D1 through the drain terminal D of the FET. At the anode end, the PIN diode D1 is preceded by a filter section consisting of a resistor R3 and a capacitor C3. The lead to the drain terminal D of the FET contains two series-connected resistors R4 and R5 whose junction is grounded through a capacitor C4 to filter out spurious voltages and to provide a path to ground for radio frequencies, and whose function will be explained below. The capacitor C3 of the filter section forms an RF short circuit and provides a path for radio frequencies from the anode of the PIN diode D1 to ground.

The PIN diode D1, like the signal source S in the circuit described with the aid of FIG. 1, provides a signal having a DC component and an AC component. While the direct current flows off through the switched current path DS of the FET, which presents a low resistance to direct current, the AC component, to which the FET presents a very high impedance, remains unattenuated. If the DC component were also applied to the transimpedance amplifier 20, it would reduce the dynamic range of the latter. The use of the FET as a direct-current sink improves the dynamic range by about 6 dB.

The resistors R4 and R5 in FIG. 2 make it possible to use the FET to additionally provide overvoltage protection for the transimpedance amplifier 20. Advantage is taken of the fact that as the high-frequency component of an optical signal increases, so does the direct current flowing through the PIN diode D1. This direct current produces a voltage drop across the resistors R4 and R5, with the low-value current-limiting resistor R4 contributing only a small amount to the voltage drop, and shifts the operating point of the FET toward the ohmic region of the FET's family of characteristics. If the value of the resistor R5 is chosen so that under overload conditions the operating point is shifted far into this ohmic region, the source-drain path SD will act as a low-value shunt at the input of the transimpedance amplifier 20, thus preventing the latter from being overloaded.

The effect of the resistors R4 and R5 can also be produced by means of a closed loop which acts on the drain potential of the FET and wherein the controlled quantity is the output signal from the transimpedance amplifier 20. The FET then operates as a controlling element in the closed loop.

Figure 3:
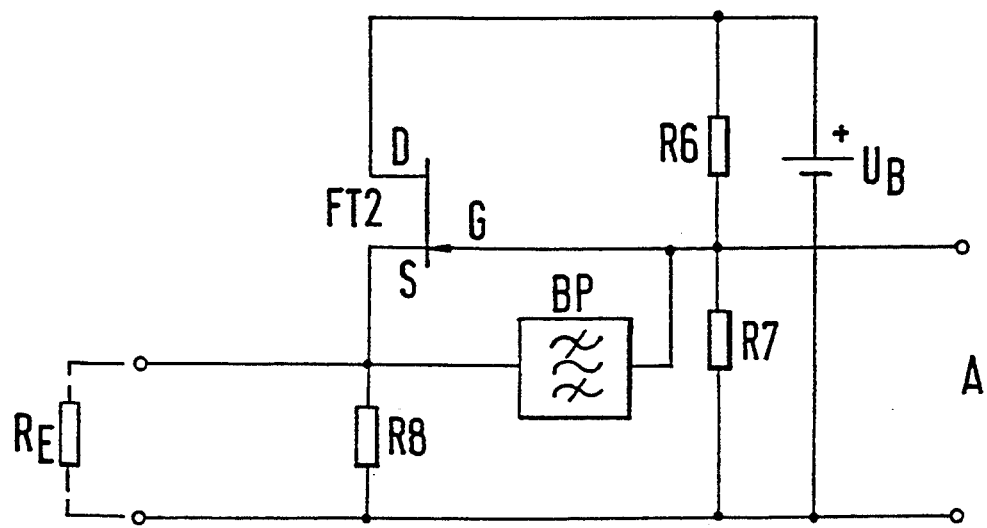
FIG. 3 shows the invention in an embodiment which improves the frequency response of a bandpass filter.

FIG. 3 shows that the current sink according to the invention can be used not only as a direct-current sink but also as a sink for direct and alternating currents. As in FIG. 2, the source terminal of an FET FT2 is connected to a signal source. This signal source consists of a resistor R8 and a source connected in parallel therewith which has an impedance $R_E$ and delivers a signal having a frequency mixture. The drain terminal D of the FET is connected to the positive terminal of a voltage source $U_B$. The latter is shunted by a voltage divider consisting of resistors R6 and R7 for setting the gate potential of the FET.

Instead of a coupling capacitor, a bandpass filter BP is connected between the source S and gate G terminals of the FET. The switched current path DS of the FET thus acts as a current sink for all currents which are not alternating currents with a frequency lying in the passband of the bandpass filter BP. A high resistance is only presented to alternating currents passed by the bandpass filter BP. The FET thus improves the action of the bandpass filter BP.

Instead of a bandpass filter, other components with frequency-dependent passbands may be employed and improved in their action.

It will be apparent to one of ordinary skill in the art that the manner of making and using the claimed invention has been adequately disclosed in the above-written description of the preferred embodiment taken together with the drawings.

It will be understood that the above description of the present invention is susceptible to various modifications, changes and adaptations, and the same are intended to be comprehended within the meaning and range of equivalents of the appended claims.

I claim:

1. A current sink circuit comprising:
   an electronic component having a control terminal, a current input terminal and a current output terminal, the current input and output terminals defining a switched current path, the switched current path being switchable by the control terminal to a low-impedance condition for sinking a current flowing through the switched current path; and
   filter means, directly coupled to the control terminal and the current input terminal, and having a frequency-dependent passband, for passing signals of a predetermined frequency range from the current input terminal to the control terminal, thereby making the electronic component present a high impedance to the signals of the predetermined frequency range;
   wherein, the current sink circuit acts on an input thereto and receives current components of an input signal which are not processed further by the electronic component.

2. A current sink as claimed in claim 1, wherein the filter means comprises a capacitor.

3. A current sink as claimed in claim 1, wherein the filter means comprises an active or a passive filter.

4. A current sink as claimed in claim 1, wherein the electronic component comprises a transistor.

5. A current sink as claimed in claim 4, wherein the transistor comprises a field-effect transistor having a high-resistance control input.

6. A current sink as claimed in claim 1, wherein the filter means keeps an alternating-voltage signal out of the switched current path.

7. An arrangement having a current sink comprising:
   an electronic component having a control terminal, a current input terminal and a current output terminal, the current input and output terminals defining a switched current path, the switched current path being switchable by the control terminal to a low-impedance condition for sinking a current flowing through the switched current path; and
   filter means, directly coupled to the control terminal and the current input terminal, and having a frequency-dependent passband, for passing signals of a predetermined frequency range from the current input terminal to the control terminal, thereby making the electronic component present a high impedance to the signals of the predetermined frequency range;
   wherein the switched current path is coupled to an optical-to-electric transducer, and the current flowing into the switched current path comprises a direct-current component of an output of the optical-to-electric transducer.

8. An arrangement having a current sink as claimed in claim 1, for protecting a broadband amplifier against overload, wherein an output of the broadband amplifier is connected to an input of the switched current path, the arrangement including means for varying the potential of an output terminal of the switched current path in accordance with one of the level of a current flowing into the switched current path and an output signal of the broadband amplifier.

9. An arrangement having a current sink as claimed in claim 1, for improving the frequency response of a filter and for reducing the risk of the filter being overlapped, wherein an output of the filter is coupled to an input of the switched current path.

* * * * *